United States Patent
Lai

(10) Patent No.: US 9,196,734 B2
(45) Date of Patent: Nov. 24, 2015

(54) THIN-FILM TRANSISTOR SUBSTRATE AND METHOD FOR FABRICATING THE SAME, DISPLAY

(71) Applicants: INNOCOM TECHNOLOGY (SHENZHEN) CO., LTD., Shenzhen (CN); CHIMEI INNOLUX CORPORATION, Chu-Nan (TW)

(72) Inventor: Szu-Wei Lai, Chu-Nan (TW)

(73) Assignees: INNOCOM TECHNOLOGY (SHENZHEN) CO., LTD. (CN); INNOLUX CORPORATION (TW)

( * ) Notice: Subject to any disclaimer, the term of this patent is extended or adjusted under 35 U.S.C. 154(b) by 214 days.

(21) Appl. No.: 13/714,976

(22) Filed: Dec. 14, 2012

(65) Prior Publication Data

US 2013/0153872 A1 Jun. 20, 2013

(30) Foreign Application Priority Data

Dec. 16, 2011 (TW) .............................. 100146718 A

(51) Int. Cl.
| | | |
|---|---|---|
| *H01L 29/41* | (2006.01) | |
| *H01L 51/52* | (2006.01) | |
| *H01L 29/786* | (2006.01) | |
| *H01L 33/00* | (2010.01) | |
| *H01L 21/02* | (2006.01) | |
| *H01L 21/3213* | (2006.01) | |
| *H01L 29/417* | (2006.01) | |
| *H01L 29/423* | (2006.01) | |
| *H01L 29/45* | (2006.01) | |
| *H01L 29/49* | (2006.01) | |
| *H01L 27/12* | (2006.01) | |

(52) U.S. Cl.
CPC ........ *H01L 29/786* (2013.01); *H01L 21/02697* (2013.01); *H01L 21/32134* (2013.01); *H01L 27/124* (2013.01); *H01L 29/41733* (2013.01); *H01L 29/42384* (2013.01); *H01L 29/458* (2013.01); *H01L 29/4908* (2013.01); *H01L 33/0041* (2013.01); *H01L 51/52* (2013.01)

(58) Field of Classification Search
CPC ............ H01L 51/5209; H01L 51/5215; H01L 51/5225; H01L 51/5231
See application file for complete search history.

(56) References Cited

U.S. PATENT DOCUMENTS

| | | | | |
|---|---|---|---|---|
| 6,806,570 | B1 * | 10/2004 | Lee et al. | ........................ 257/737 |
| 2003/0122132 | A1 * | 7/2003 | Yamazaki | ......................... 257/72 |
| 2005/0162602 | A1 * | 7/2005 | Yamazaki et al. | ............ 349/141 |

FOREIGN PATENT DOCUMENTS

| | | |
|---|---|---|
| JP | 55-138259 | 10/1980 |
| JP | 60-193362 | 10/1985 |

OTHER PUBLICATIONS

Office Action dated Feb. 27, 2015 from corresponding No. CN 201110422935.5.

*Primary Examiner* — Shaun Campbell
*Assistant Examiner* — Raj R Gupta
(74) *Attorney, Agent, or Firm* — Hauptman Ham, LLP

(57) ABSTRACT

The invention provides a thin-film transistor substrate, including: a substrate; a metal lead structure formed on the substrate, wherein the metal lead structure includes: a main conductor layer formed on the substrate, wherein the main conductor has a sidewall; a top conductor layer having a first portion, second portion and third portion, wherein the first portion is formed on the main conductor layer, the second portion is formed on the sidewall of the main conductor layer, and the third portion is formed on the substrate, and a continuous structure is formed by the first portion, the second portion and the third portion.

19 Claims, 7 Drawing Sheets

THIN-FILM TRANSISTOR SUBSTRATE AND METHOD FOR FABRICATING THE SAME, DISPLAY

CROSS REFERENCE TO RELATED APPLICATIONS

This Application claims priority of Taiwan Patent Application No. 100146718, filed on Dec. 16, 2011, the entirety of which is incorporated by reference herein.

BACKGROUND

1. Field

The present disclosure relates to a thin-film transistor substrate, and in particular relates to a thin-film transistor substrate with a self-protective conductor layer.

2. Description of the Related Art

The metal lead structure is often used in a thin-film transistor, and it may be a gate electrode, gate line, data line or source/drain electrode.

FIG. 1 shows a cross-sectional schematic representation of a typical metal lead structure 10 of prior art. The metal lead structure 10 comprises a composite metal layer 14 formed on a substrate 12, wherein the composite metal layer 14 comprises a bottom molybdenum (Mo) layer 14a, an aluminum layer 14b and a top molybdenum layer 14c. However, the conventional metal lead structure 10 has the following disadvantages.

(1) The fabrication processes of the metal lead structure 10 comprise an acid solution etching step. However, the aluminum layer 14b may be exposed by the acid solution etching step. Additionally, the exposed aluminum layer 14b may be attacked by another acid solution or base solution etchant in the following process because it is not protected.

(2) Because the thermal expansion coefficient of the aluminum layer 14b is higher than that of the bottom molybdenum layer 14a or top molybdenum layer 14c, a hillock may be formed in the aluminum layer 14b, resulting in a short-circuit problem.

(3) FIG. 2 shows a cross-sectional schematic representation of a typical via hole formed in a metal lead structure 10 of prior art. A protective layer 16 is formed on the complex metal layer 14, and a via hole 17 is formed in the protective layer 16, and a conducting layer 18 (such as indium tin oxide, ITO) is formed on the via hole 17. Because the conducting layer 18 is liable to react with the aluminum layer 14b, an unwanted insulating material 19 (such as aluminum oxide $AlO_x$) may be formed, resulting in an electrical instability problem.

(4) When the composite metal layer 14 is used as a gate electrode and the etching process is not well controlled, the aluminum layer 14b may be exposed and the aluminum atom may diffuse into an active layer of a thin-film transistor. Thus, the thin-film transistor device exhibits poor electrical performance.

Therefore, there is a need to develop a thin-film transistor substrate with a self-protective conductor layer to solve the above-mentioned disadvantages.

BRIEF SUMMARY

The disclosure provides a thin-film transistor substrate, comprising: a substrate; a metal lead structure formed on the substrate, wherein the metal lead structure comprises: a main conductor layer formed on the substrate, wherein the main conductor has a sidewall; a top conductor layer having a first portion, second portion and third portion, wherein the first portion is formed on the main conductor layer, the second portion is formed on the sidewall of the main conductor layer, and the third portion is formed on the substrate, and a continuous structure is formed by the first portion, the second portion and the third portion.

The disclosure also provides a display, comprising: a thin-film transistor substrate of the disclosure; a substrate disposed oppositely to the thin-film transistor substrate; and a display media formed between the thin-film transistor substrate and the substrate.

The disclosure also provides a method for fabricating a thin-film transistor substrate, comprising: providing a substrate; forming a main conductor layer and a top conductor layer on the substrate; forming a patterned photoresist layer on the top conductor layer; performing a first etching step to remove a portion of the main conductor layer and a portion of the top conductor layer and to expose a sidewall of the main conductor layer and the substrate; performing a second etching step, wherein an etching rate of the main conductor layer is larger than that of the top conductor layer to make the top conductor layer extend downward to cover the main conductor layer, and the top conductor layer has a first portion formed on the main conductor layer, a second portion formed on the sidewall of the main conductor layer, a third portion formed on the substrate, and a continuous structure is made by the first portion, the second portion and the third portion; and removing the patterned photoresist layer.

A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

FIGS. 3A-3E show cross-sectional schematic representations of various stages of fabricating a thin-film transistor substrate in accordance with an embodiment of the disclosure. Firstly, referring to FIG. 3A, a substrate 32 is provided. For simplicity, no other structure is showed in the substrate 32. Alternatively, other interconnecting structures may be formed in the substrate 32. Then, a bottom conductor layer 34, a main conductor layer 36 and a top conductor layer 38 are formed on the substrate 32 by an evaporation method or sputtering method.

In another embodiment, the main conductor layer 36 and the top conductor layer 38 are formed on the substrate 32.

The main conductor layer 36 comprises aluminum (Al), copper (Cu) or combinations thereof. However, the materials of the main conductor layer 36 are not limited to the above-mentioned materials, and other materials with low resistance are also included in the disclosure.

The bottom conductor layer 34 and the top conductor layer 38 respectively comprise molybdenum (Mo), titanium (Ti), tantalum (Ta), Chromium (Cr) or combinations thereof. The function of the bottom conductor layer 34 is to increase the adhesion between the substrate 32 and the main conductor layer 36. The function of the top conductor layer 38 is to protect the main conductor layer 36 and prevent the main conductor layer 36 from acid corrosion. Another function of the top conductor layer 38 is to be used as a buffer layer when the top conductor layer 38 electrically contacts a transparent conducting layer. The materials of the top conductor layer 38 are not limited to the above-mentioned materials, and other refractory metal materials are also included in the disclosure. Additionally, the main conductor layer 36 has a thickness larger than that of the bottom conductor layer 34 or that of the top conductor layer 38.

Figure 3A:
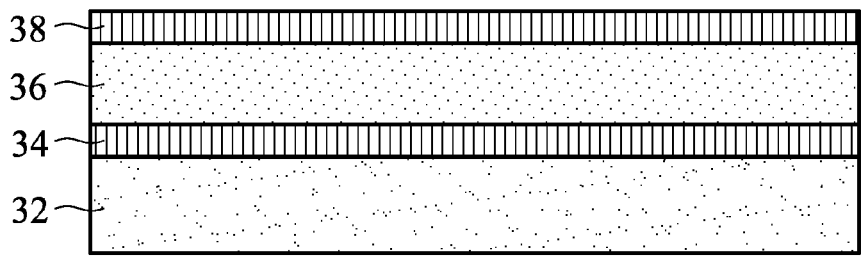
FIGS. 3A-3E show cross-sectional schematic representations of various stages of fabricating a thin-film transistor substrate in accordance with an embodiment of the invention.
Figure 3B:
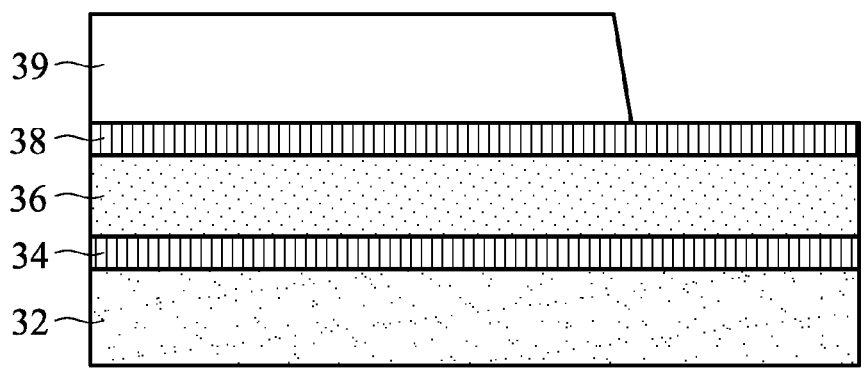

Then, referring to FIG. 3B, a patterned photoresist layer 39 is formed on the top conductor layer 38 by a photolithography process. The photolithography process comprises photoresist coating, soft baking, mask aligning, exposure, post-exposure, developing photoresist and hard baking. The photolithography process is known to those skilled in the art, and thus is omitted for brevity.

Figure 3C:
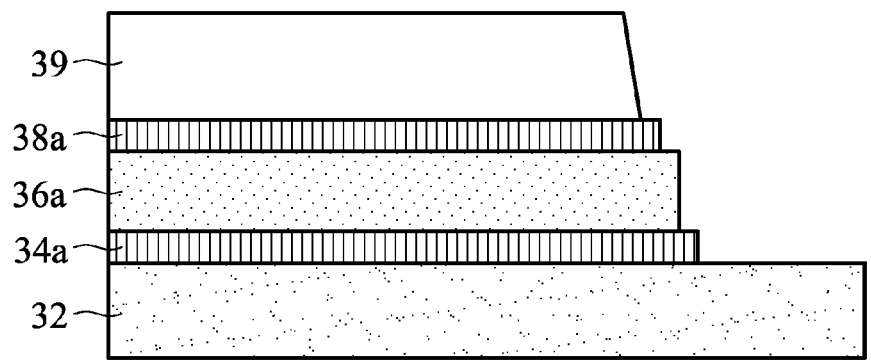

Referring to FIG. 3C, a first etching step is performed to remove a portion of the main conductor layer 36 and a portion of the top conductor layer 38 and to expose the sidewall of the main conductor layer 36 and the substrate 32. After the first etching step, a firstly etched bottom conductor layer 34a, a firstly etched main conductor layer 36a and a firstly etched top conductor layer 38a are obtained.

The first etching step is performed by using an acid solution as etchant. In another embodiment, the acid solution is a mixed solution containing phosphorous acid, acetic acid, nitric acid and water.

Note that after the first etching step, the sidewall of the firstly etched main conductor layer 36a is exposed and not protected by the firstly etched top conductor layer 38a, and thus a hillock problem may be formed in the firstly etched main conductor layer 36a or a short-circuit problem may be produced.

Figure 3D:
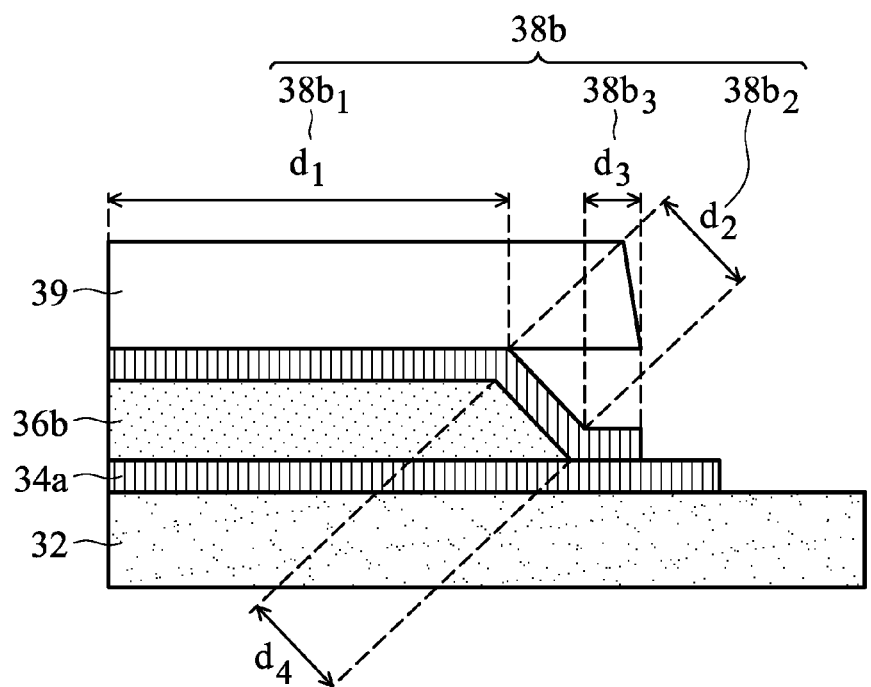

Referring to FIG. 3D, a second etching step is performed, wherein an etching rate of the firstly etched main conductor layer 36a is larger than that of the firstly etched top conductor layer 38a. Thus, after the second etching step, the secondly etched top conductor layer 38b extends downward to cover the sidewall of the secondly etched main conductor layer 36b. As a result, the secondly etched top conductor layer 38b is divided into three portions and comprises a first portion $38b_1$, a second portion $38b_2$ and a third portion $38b_3$. The first portion $38b_1$ is formed on the secondly etched main conductor layer 36b, the second portion $38b_2$ is formed on the sidewall of the secondly etched main conductor layer 36b, and the third portion $36b_3$ is formed on the substrate 32. A continuous structure is made by the first portion $38b_1$, the second portion $38b_2$ and the third portion $38b_3$.

Note that the first portion $38b_1$ has a length $d_1$, the second portion $38b_2$ has a length $d_2$ and the third portion $38b_3$ has a length $d_3$. In order to extend downward to cover the sidewall of the secondly etched main conductor layer 36b, the sum of the length $d_2$ of second portion $38b_2$ and the length $d_3$ of the third portion $38b3$ must be greater than the length $d_4$ of the sidewall of the secondly etched main conductor layer 36b (i.e. $(d_2+d_3)>d_4$).

In one embodiment, the same acid solution used in the first etching step may be chosen in the second etching step. Additionally, a suitable etching mode is chosen in the second etching step, such as a spray etching mode or dip etching mode, making the etching rate of the firstly etched main conductor layer 36a larger than that of the firstly etched top conductor layer 38a.

In another embodiment, a base solution (such as sodium hydroxide (NaOH), potassium hydroxide (KOH)) may be chosen in the second etching step, making the etching rate of the firstly etched main conductor layer 36a larger than that of the firstly etched top conductor layer 38a. These etching steps are merely exemplary and are not meant to be limiting to the disclosure. Those skilled in the art may modify or change these etching steps according to the actual application.

Figure 3E:
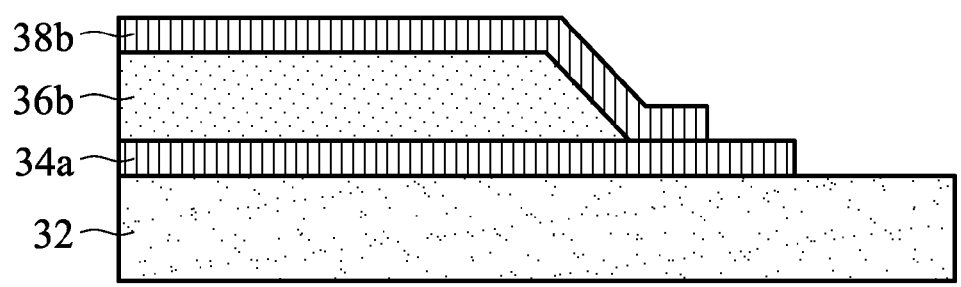

Then, referring to FIG. 3E, the patterned photoresist layer 39 is removed to obtain a thin-film transistor substrate 30 of the invention. Note that the secondly etched top conductor layer 38b is a non-conformal layer and has a uniform thickness.

Figure 4A:
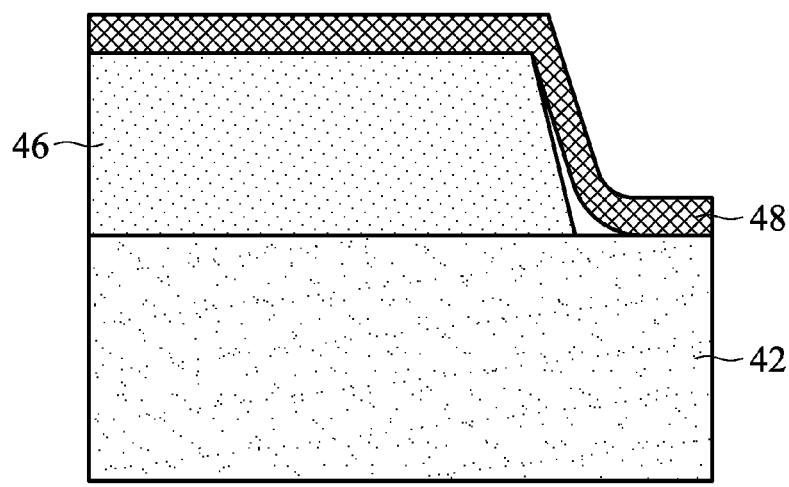
FIGS. 4A-4C show cross-sectional schematic representations of a thin-film transistor substrate 40 in accordance with an embodiment of the invention.
Figure 4B:
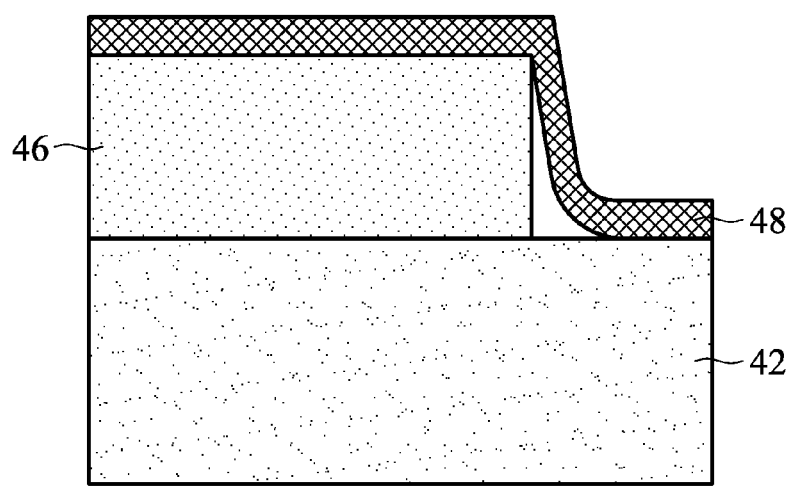
Figure 4C:
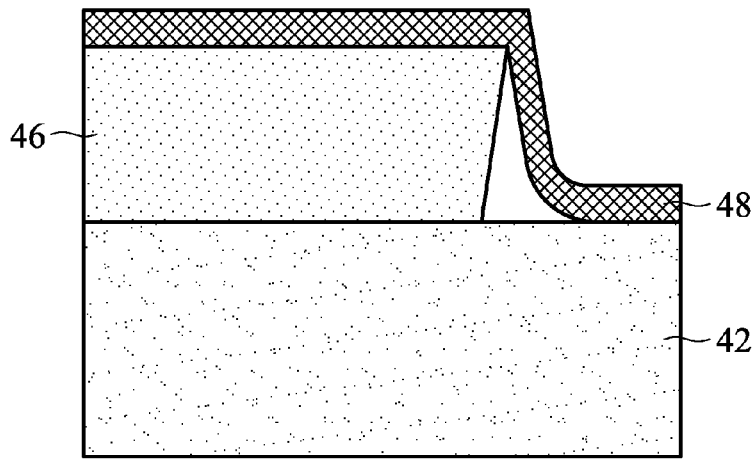

FIGS. 4A-4C show cross-sectional schematic representations of a thin-film transistor substrate 40 in accordance with an embodiment of the invention. A top conductor layer 48 and a main conductor layer 46 are formed on the substrate 42, and the top conductor layer 48 is continuously formed on the main conductor layer 46, on the sidewall of the main conductor layer 46 and extending on the substrate 42.

As shown in FIG. 4A, the angle between the sidewall of the main conductor layer 46 and the substrate 42 is greater than 90 degrees. As shown in FIG. 4B, the angle between the sidewall of the main conductor layer 46 and the substrate 42 is equal to 90 degrees. As shown in FIG. 4C, the angle between the sidewall of the main conductor layer 46 and the substrate 42 is less than 90 degrees. However, no matter what the angle is, the top conductor layer 48 has a uniform thickness and is a non-conformal layer. Thus, there is a gap between the top conductor layer 48 and the main conductor layer 46.

Figure 5A:
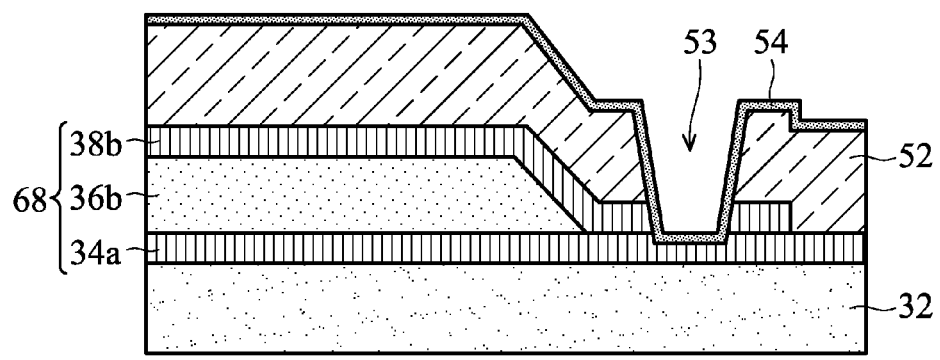
FIG. 5A shows a cross-sectional schematic representation of a via hole formed in a thin-film transistor substrate 50 in accordance with an embodiment of the invention.
Figure 5B:
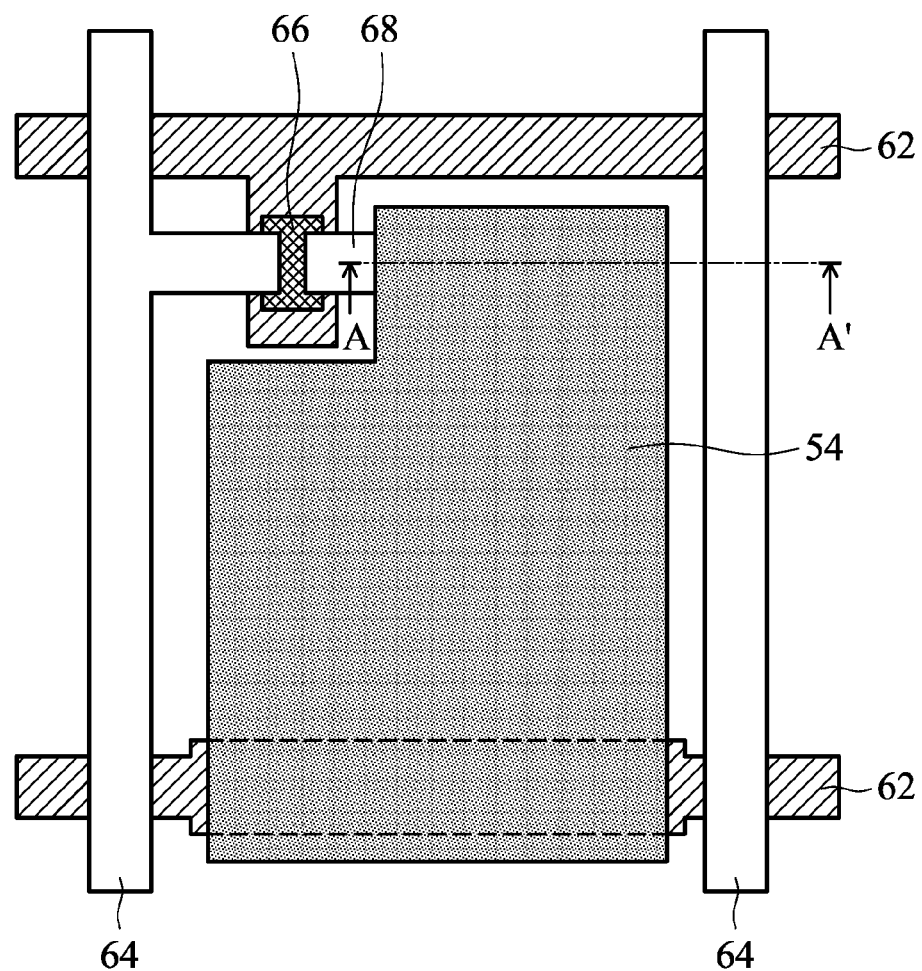
FIG. 5B shows a cross-sectional schematic representation, taken along AA' line of FIG. 5A.

Furthermore, FIG. 5A show a cross-sectional schematic representation of a via hole formed in a thin-film transistor substrate 50 in accordance with an embodiment of the invention, wherein like elements are identified by the same reference numbers as in FIG. 3E, and thus are omitted for clarity. FIG. 5B shows a cross-sectional schematic representation, taken along AA' line of FIG. 5A. As shown in FIG. 5A, a conductive layer 54 is in contact with the metal lead structure of the disclosure (comprising the top conductor layer 38b, the main conductor layer 36b and bottom conductor layer 34a). In this embodiment, the metal lead structure is used as a source/drain electrode 68.

The source/drain electrode 68 is formed by the following steps. After forming the thin-film transistor substrate of FIG. 3E, a protective layer 52 is formed on the secondly etched top conductor layer 38b. Then, a via hole 53 is formed in the protective layer 52 to expose the secondly etched top conductor layer 38b. Next, a conductive layer 54 is formed in the via hole 53.

Note that because the sidewall of the main conductor layer 36 is covered by the main conductor layer 38, and the via hole 53 is formed on the third portion of the top conductor layer 38

Figure 1:
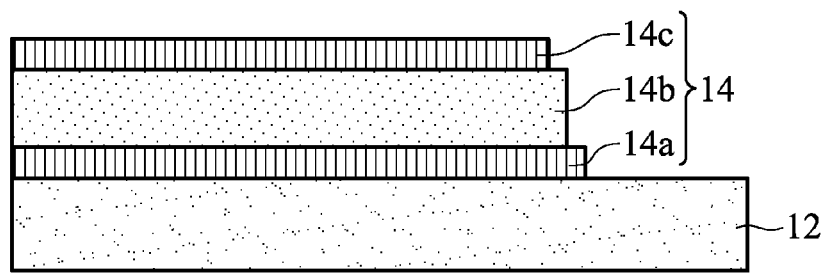
FIG. 1 shows a cross-sectional schematic representation of a typical metal lead structure of prior art.
Figure 2:
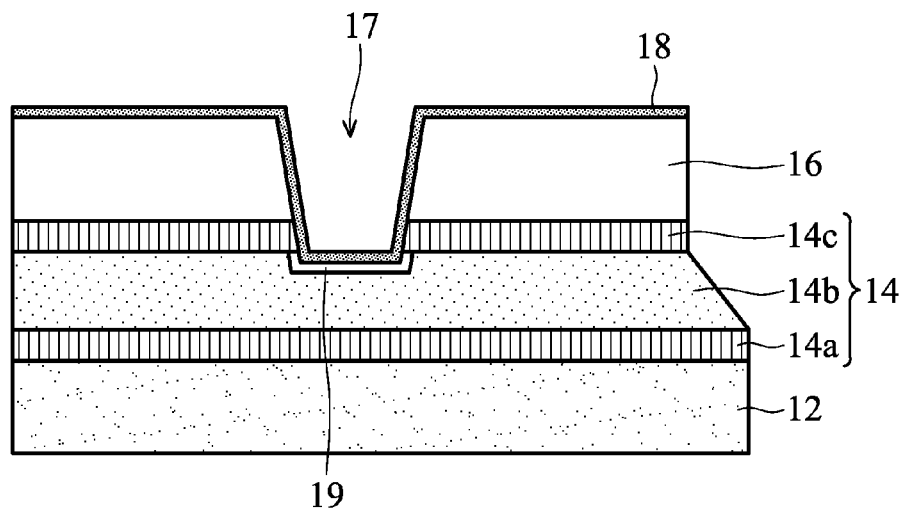
FIG. 2 shows a cross-sectional schematic representation of a typical via hole formed in metal lead structure of prior art.

(the position of the third portion is shown in FIG. 3D), the conventional electrical instability problem of FIG. 2 may be overcome.

Additionally, the invention provides a display. The display comprises a thin-film transistor substrate and a substrate disposed oppositely to each other; and a display media formed between the thin-film transistor substrate and the substrate. The display media may be a liquid crystal layer or an organic emitting layer.

In addition to serving as the source/drain electrode 68 (FIG. 5A), the metal lead structure of the disclosure also has another application. For example, in FIG. 5B, the thin-film transistor substrate comprises a thin-film transistor array, wherein the thin-film transistor array comprises a gate line 62, data line 64 or gate electrode 66.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin-film transistor substrate, comprising:
   a first substrate; and
   a metal lead structure formed on the first substrate, wherein the metal lead structure comprises:
   a main conductor layer formed on the first substrate, wherein the main conductor has a sidewall; and
   a top conductor layer having a first portion, a second portion and a third portion,
   wherein
      the first portion is formed on the main conductor layer,
      the second portion is formed on the sidewall of the main conductor layer,
      the third portion is formed on the first substrate,
      a continuous structure is made by the first portion, the second portion and the third portion, and
      the second portion of the top conductor layer is separated from the main conductor layer by an air-gap between the second portion of the top conductor layer and the sidewall of the main conductor layer.

2. The thin-film transistor substrate as claimed in claim 1, wherein the top conductor layer has a uniform thickness.

3. The thin-film transistor substrate as claimed in claim 1, wherein the top conductor layer is a non-conformal layer.

4. The thin-film transistor substrate as claimed in claim 1, wherein a sum of the length (d2) of the second portion of the top conductor layer and the length (d3) of the third portion of the top conductor layer is greater than the length (d4) of the sidewall of the main conductor layer ((d2+d3)>d4).

5. The thin-film transistor substrate as claimed in claim 1, further comprising:
   a bottom conductor layer formed between the substrate and the main conductor layer.

6. The thin-film transistor substrate as claimed in claim 5, wherein the bottom conductor layer comprises molybdenum (Mo), titanium (Ti), tantalum (Ta), Chromium (Cr) or combinations thereof.

7. The thin-film transistor substrate as claimed in claim 1, wherein the main conductor layer comprises aluminum (Al), copper (Cu) or combinations thereof.

8. The thin-film transistor substrate as claimed in claim 1, wherein the top conductor layer comprises molybdenum (Mo), titanium (Ti), tantalum (Ta), Chromium (Cr) or combinations thereof.

9. The thin-film transistor substrate as claimed in claim 1, wherein the metal lead structure is a gate line.

10. The thin-film transistor substrate as claimed in claim 1, wherein the metal lead structure is a data line.

11. The thin-film transistor substrate as claimed in claim 1, wherein the metal lead structure is a gate electrode.

12. The thin-film transistor substrate as claimed in claim 1, wherein the metal lead structure is a source/drain electrode.

13. A display, comprising:
   a thin-film transistor substrate as claimed in claim 1;
   a second substrate disposed oppositely to the thin-film transistor substrate; and
   a display media formed between the thin-film transistor substrate and the substrate.

14. The display as claimed in claim 13, wherein the display media is a liquid crystal layer or an organic emitting layer.

15. A method for fabricating a thin-film transistor substrate, comprising:
   providing a substrate;
   sequentially forming a main conductor layer and a top conductor layer on the substrate;
   forming a patterned photoresist layer on the top conductor layer;
   performing a first etching step to remove a portion of the main conductor layer and a portion of the top conductor layer and to expose sidewall of the main conductor layer and the substrate;
   performing a second etching step, wherein
      an etching rate of the main conductor layer is larger than that of the top conductor layer to make the top conductor layer extend downward to cover the main conductor layer,
      the top conductor layer has a first portion formed on the main conductor layer, a second portion formed on the sidewall of the main conductor layer, and a third portion formed on the substrate,
      a continuous structure is made by the first portion, the second portion and the third portion, and
      the second portion of the top conductor layer is separated from the main conductor layer by an air-gap between the second portion of the top conductor layer and the sidewall of the main conductor layer; and
   removing the patterned photoresist layer.

16. The method for fabricating a thin-film transistor substrate as claimed in claim 15, before forming the main conductor layer, further comprising forming a bottom conductor layer on the substrate.

17. The method for fabricating a thin-film transistor substrate as claimed in claim 15, wherein the first etching step is performed by using an acid solution as etchant.

18. The method for fabricating a thin-film transistor substrate as claimed in claim 15, wherein the second etching step is performed by using an acid solution as etchant with a spraying etching mode or a dip etching mode.

19. The method for fabricating a thin-film transistor substrate as claimed in claim 15, wherein the second etching step is performed by using a base solution as etchant.

* * * * *